US006822487B2

(12) United States Patent
Tejima et al.

(10) Patent No.: US 6,822,487 B2
(45) Date of Patent: Nov. 23, 2004

(54) METHOD AND APPARATUS FOR SYNTHESIZING AND UTILIZING WAVEFORMS

(75) Inventors: Go Tejima, Hachioji (JP); Norihide Yamada, Kokubunji (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/617,969

(22) Filed: Jul. 10, 2003

(65) Prior Publication Data

US 2004/0010537 A1 Jan. 15, 2004

(30) Foreign Application Priority Data

Jul. 11, 2002 (JP) ....................................... 2002-202842

(51) Int. Cl.[7] ................................................ H03B 21/00
(52) U.S. Cl. ........................ 327/105; 327/106; 708/271
(58) Field of Search ................................ 327/105–107, 327/352; 708/271

(56) References Cited

U.S. PATENT DOCUMENTS 5,327,021 A * 7/1994 Kanai et al. .................. 327/74

OTHER PUBLICATIONS

G.C. Temes et al., "The Optimization of Bandlimited Systems", Proc. IEEE, vol. 61, No. 2, pp. 196–234, Feb., 1973.

* cited by examiner

*Primary Examiner*—Kenneth B. Wells

(57) ABSTRACT

A method is provided for synthesizing an arbitrary waveform that approximates a specific waveform. The method includes specifying respective frequencies of component waveforms to be used to generate the arbitrary waveform, the frequencies being less than the maximum frequency needed to synthesize the specific waveform. The method further includes performing a least squares optimization of respective amplitudes and phases of the component waveforms across at least one predetermined time interval. The component waveforms having the amplitudes and phases optimized by the least squares optimization are then summed to produce the arbitrary waveform.

20 Claims, 5 Drawing Sheets

METHOD AND APPARATUS FOR SYNTHESIZING AND UTILIZING WAVEFORMS

TECHNICAL FIELD

The present invention relates generally to the generation of arbitrary waveforms, and more particularly to a method and apparatus for synthesizing and for utilizing such waveforms.

BACKGROUND ART

Various types of waveforms and waveform generators are used not just in technical fields, but also in numerous industrial and commercial applications. This is particularly true in electrical and electronic technologies, and perhaps even more importantly in optical technologies such as fiber optic data transmission. The needs are so demanding that more and more highly versatile mathematical techniques are required for generating a seemingly limitless variety of waveforms, and to handle the demands of technologies, such as communication and measurement, that are constantly increasing in speed.

Waveforms can be represented by mathematical functions, and ideally, the waveforms can then be realized or created by combining or superimposing certain groups of single-frequency components ranging from a frequency of zero to a frequency that is nearly infinite. In actuality, however, there are upper limits to the frequencies that can be utilized in real-world systems because of frequency response limitations in the equipment and the transmission lines. This means, as a practical matter, that frequency components at extremely high frequencies may not be available. Such upper frequency limitations then degrade the precision with which waveform generators can actually create the desired waveforms.

In theory, an ideal system could accurately generate virtually any waveform (an "arbitrary" waveform) and could specify the mathematical function that defines the desired "arbitrary" waveform. A simple example of such arbitrary function waveform generation shows, however, how difficult this can be in practice. "Sawtooth" waves are very common, uncomplicated waveforms that are needed and are very useful in all sorts of electronic applications. Yet sawtooth waveforms are surprisingly difficult to generate, particularly at higher frequencies, such as used in cell phones, satellite communications, wireless internet access, and so forth.

The difficulty with sawtooth waveforms is caused by the sharp ("point-like") transitions between the increasing and decreasing sides of the waveform. To keep these transitions sharp, very high-frequency capabilities are required. Otherwise, the transitions become "blunted". Since most electronic and optical equipment is "band-limited" (i.e., cannot carry frequencies in the highest frequency bands), it is difficult in real-world systems to accurately propagate even a simple sawtooth voltage waveform. Similar considerations actually make it difficult even to accurately generate or create such a waveform in the first place (at higher frequencies). As can be appreciated, similar problems are presented with other waveforms that are more complicated.

The prior art presents many analytical approaches and proposes a number of solutions for these problems. Techniques are available for generating desired waveforms within a limited frequency bandwidth utilizing band-limited mathematical functions. However, generating such mathematical functions is not easy, both in the case of analog generation and at high frequencies. Accordingly, there continues to be a need for simpler, less complicated methods for generating function waveforms. Furthermore, in cases where distortion of the waveform occurs in a band-limited propagation medium, it is desirable to be able to correct this distortion.

Solutions to these problems have been long sought but prior developments have not taught or suggested any solutions and, thus, solutions to these problems have long eluded those skilled in the art.

DISCLOSURE OF THE INVENTION

The present invention provides a method for synthesizing an arbitrary waveform that approximates a specific waveform. Respective frequencies of component waveforms to be used to generate the arbitrary waveform are specified, the frequencies being less than the maximum frequency needed to synthesize the specific waveform. A least squares optimization of respective amplitudes and phases of the component waveforms is performed across at least one predetermined time interval. The component waveforms having the amplitudes and phases optimized by the least squares optimization are then summed to produce the arbitrary waveform. This method provides a simpler, more cost-effective means of generating an ideal waveform approximation at high frequencies.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
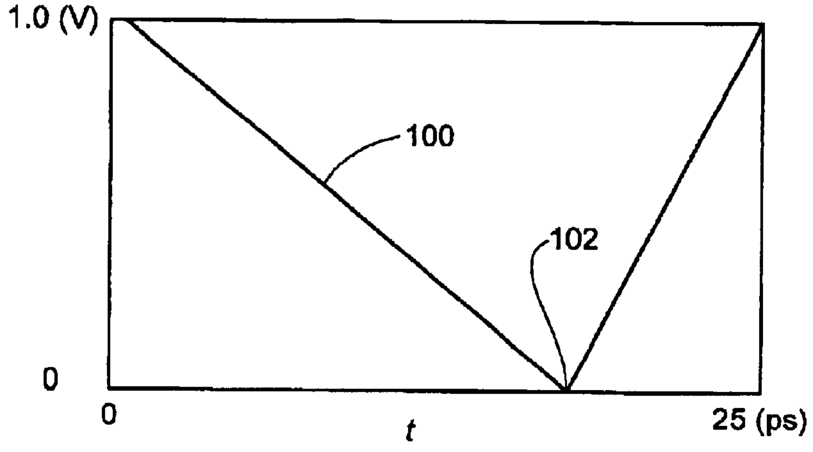
FIG. 1 is a view of an ideal sawtooth wave in accordance with the present invention.

In the following description, numerous specific details are given to provide a thorough understanding of the invention. However, it will be apparent to one skilled in the art that the invention may be practiced without these specific details. In order to avoid obscuring the present invention, some well-known circuits and system configurations are not disclosed in detail. Additionally, the drawings showing embodiments of the apparatus are semi-diagrammatic and not to scale and, particularly, some of the graphs are drawn for the clarity of presentation and may therefore be slightly exaggerated in the drawing FIGs.

Referring now to FIG. 1, therein is shown an ideal sawtooth wave 100. As depicted, the ideal sawtooth wave 100 is a function of time t, having a repetition period for example of 25 ps (40 GHz) and a maximum amplitude $V_s$, of one volt. As is well known from the theories of signal processing and Fourier transforms, the ideal sawtooth wave 100 contains high-frequency components that are necessary for defining the sharp "turn-around" points, such as a point 102, where the direction of the ideal sawtooth wave 100 reverses. It is similarly well known that it is difficult to propagate these higher frequency components through a band-limited medium.

Figure 2:
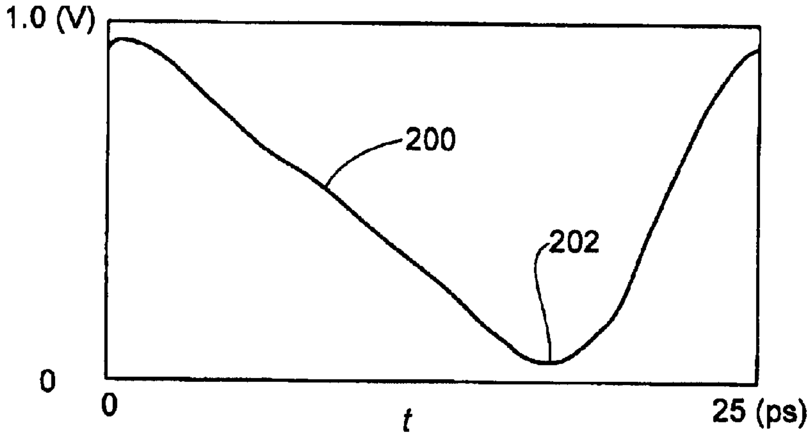
FIG. 2 is a view of a degraded sawtooth wave.

Referring now to FIG. 2, therein is shown a degraded sawtooth wave 200 resulting from low-pass filtering for example with an upper-limit frequency of 120 GHz. As can be seen, the elimination of frequency components higher than 120 GHz from the ideal sawtooth wave 100 shown in FIG. 1 has substantially blunted the shape of the turn-around, represented by region 202, of the degraded sawtooth wave 200. In other words, in a band-limited medium, an ideal sawtooth wave cannot be transmitted or reproduced. Similar difficulties obtain for other waveforms and data signals having fine details, sharp transitions, and so forth.

In order to improve waveform generation and transmission under limiting circumstances such as band-limited media, previous techniques for generating desired waveforms within a limited frequency bandwidth disclose many band-limited techniques. In one such band-limited technique, a desired system function f(t), which is a function of time t, is approximated by a Chebyshev approximation using a sinc function, where the sinc function is defined as:

$$\mathrm{sinc}(t)=\sin(t)/t. \qquad \text{[Equation 1]}$$

The sinc function sinc(t) is a function, also called a "sampling function", that arises frequently in signal processing and in the theory of Fourier transforms. (For the special case of t=0, sinc(t) is assigned the value of 1.) The full name of the sinc function is "sine cardinal". The Chebyshev approximation uses the sinc function in an error minmax methodology. More particularly, a minmax approximation is performed in terms of basis functions forming a Chebyshev set.

In another example of band-limited techniques, an approximation function that has specified band-blocking characteristics or roll-off slope characteristics uses a least squares approximation method based upon a weighted sum of sinc functions.

Unfortunately, generating sinc functions can be difficult, particularly for analog generation and for higher frequencies. In fact, there is a continuing need for better methodologies for correcting waveform distortions in band-limited propagation media.

Accordingly, the present invention solves these limitations by the summation or direct superimposition of a limited number of frequency components $f_1, \ldots, f_{max}$, where $f_{max}$ is less than the highest waveform component frequency needed to correctly duplicate a specific original waveform. The limited number of frequency components $f_1, \ldots, f_{max}$, is then optimized in this frequency range by a least squares approximation. By this methodology, any desired ("arbitrary") waveform can be generated that very closely approximates the specific original waveform without needing the full bandwidth that a traditional Fourier analysis would require.

In one illustrative embodiment, the ideal sawtooth wave 100 (FIG. 1) is used to show the optimized generation of a band-limited waveform approximation for an ideal non-band-limited sawtooth waveform. As this example is developed, it will be readily understood that the invention is equally applicable to waveforms other than, and in addition to, sawtooth waveforms.

For a waveform having a period T, the ideal sawtooth wave 100 can be designated as a function n(t) of time t. The band-limited waveform approximation for the ideal sawtooth wave 100 can similarly be designated as a function g(t) of time t. Since both waveforms n(t) and g(t) are periodic functions of the period T, they can be expressed as Fourier series expansions by the following formulae, using the constants $A_i$, $B_i$, $a_j$ and $b_j$:

$$n(t) = \sum_i (A_i \cos(\omega_i t) + B_i \sin(\omega_i t)) \qquad \text{[Equation 2]}$$

$$g(t) = \sum_j (a_j \cos(\omega_j t) + b_j \sin(\omega_j t))$$

If the period T is 25 ps (f=1/T=40 GHz), then $\omega_i$ and $\omega_j$ are $2\pi f_i$ and $2\pi f_j$, and $f_i$ and $f_j$ consist of a 0 Hz component and higher harmonic components of 40 GHz (e.g. 80 GHz, 120 GHz, etc.).

In the case of g(t), there is an upper limit $f_{max}$ on the component frequency $\omega_j/(2\pi)$. For example, if the maximum frequency $f_{max}$ is 120 GHz and the repetition period T is 25 ps, then $f_j$ has only the four frequency components $f_1, \ldots, f_{max}$ of 0 Hz, 40 GHz, 80 GHz, and 120 GHz.

In accordance with the present invention, g(t) is to be determined by the method of least squares. Therefore, ξ is defined by the following formula:

$$\xi = \int_{t_0}^{t_1} [n(t) - g(t)]^2 \, dt \qquad \text{[Equation 3]}$$

The integration interval $[t_0, t_1]$ for ξ is the time interval for which optimization is desired. This time interval may be less than or equal to the waveform period T, according to the portion of the waveform for which optimization is desired. Then ξ is partially differentiated, according to the following formulae, using the coefficients $a_j$ and $b_j$ of the respective frequency components, and this partial differentiation is set equal to zero.

$$\frac{\partial \xi}{\partial a_j} = \frac{\partial}{\partial a_j} \int_{t_0}^{t_1} [n(t) - g(t)]^2 \, dt \qquad \text{[Equation 4]}$$

$$\frac{\partial \xi}{\partial b_j} = \frac{\partial}{\partial b_j} \int_{t_0}^{t_1} [n(t) - g(t)]^2 \, dt$$

Thus, the least squares optimization is performed by integrating across the specified time interval the square of the difference between the waveform n(t) and the sum of the respective component waveforms of g(t) as a function of t, and solving for a minimum value (in this case, zero).

By determining the set of coefficients CS $(=\{a_0, a_1, a_2, a_3, \ldots, b_0, b_1, b_2, b_3, \ldots\})$ that satisfies the simultaneous equations thus obtained, the function g(t) that has this set of coefficients then constitutes an optimized approximate sawtooth wave that is the best estimate function of n(t). The respective amplitudes and phases of the frequency components are determined by the respective sets $\{a_j, b_j\}$.

Figure 3:
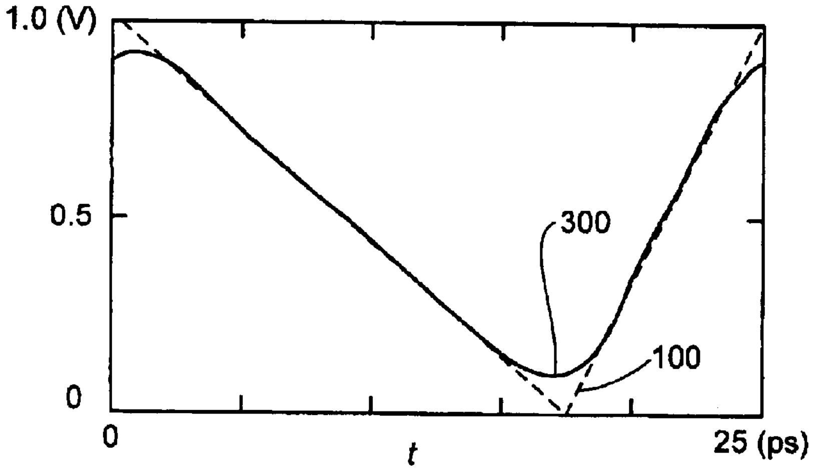
FIG. 3 is a graph depicting an optimized approximate sawtooth waveform.

Referring now to FIG. 3, therein is shown a graph that shows an optimized approximate sawtooth waveform 300 in which the time interval $[t_0, t_1]$ of 2.5 ps to 15 ps has been optimized with an upper-limit frequency $f_{max}$ of 120 GHz.

The optimized approximate sawtooth waveform 300 was obtained by optimizing the linear portion of the waveform g(t) using the above least squares method with the integration interval $[t_0, t_1]$ set with $t_0$=2.5 ps and $t_1$=15 ps. The approximation error between the optimized approximate sawtooth waveform 300 and the ideal sawtooth wave 100 can be evaluated by the standard deviation value $\mu$ of the following formula, with $T_{opt}$ set equal to $t_1-t_0$.

$$\sigma = \sqrt{\frac{1}{T_{opt}} \cdot t_0 \int_{t_0}^{t_1} [n(t) - g(t)]^2 \, dt} \quad \text{[Equation 5]}$$

For the optimization waveform example depicted in FIG. 3, in which the time interval desired for the best approximation was between $t_0$=2.5 ps and $t_1$=15 ps, the resulting optimization yielded a standard deviation value according to the above equation of $\mu=5.10\times10^4$. As will therefore be appreciated, the error in the optimized approximate sawtooth waveform 300 in the time interval $[t_0, t_1]$ is less than 1/1000 relative to the ideal sawtooth wave 100 in this same time interval.

Figure 4:
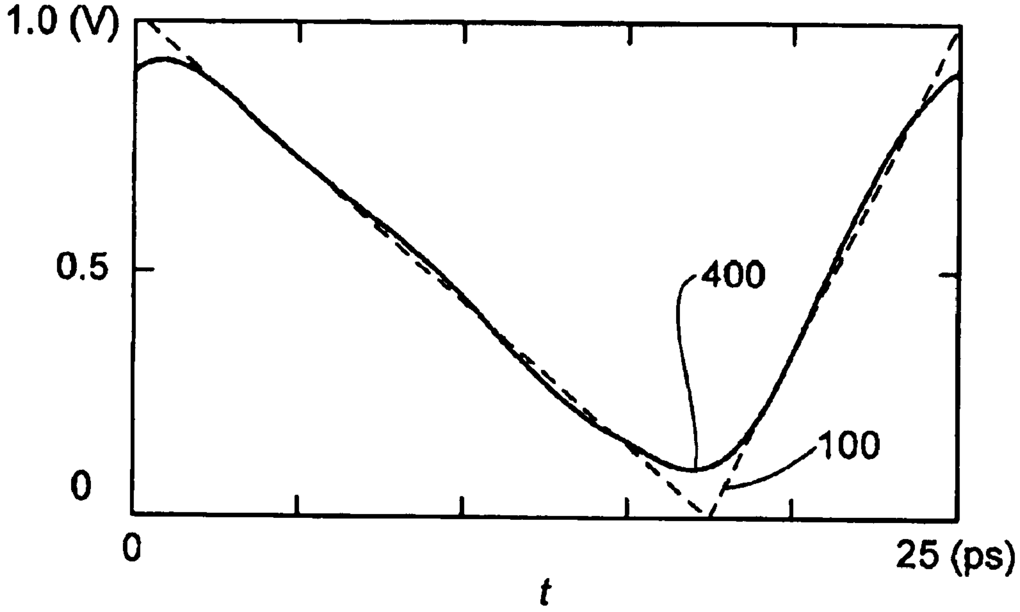
FIG. 4 is a waveform diagram of an approximate sawtooth wave that has not been optimized.

Referring now to FIG. 4, therein is shown a waveform diagram of an approximate sawtooth wave 400 having for example an upper-limit frequency of 120 GHz, but which has not been optimized. Instead, error reductions have been made consisting only of shifting the second harmonic component by 10 degrees. When the approximation error $\mu$ is then similarly determined for the same time interval $t_0$=2.5 ps to $t_1$=15 ps, compared to the ideal sawtooth wave 100, it is found that $\mu=12.1\times10^{-3}$. Accordingly, the approximate sawtooth wave 400, which is not optimized according to the present invention, contains an error of approximately 1/100.

Figure 5:
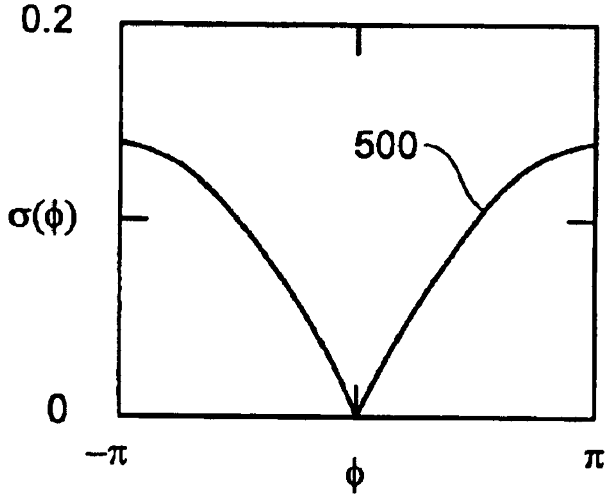
FIG. 5 is a graph of the variation in the error of the optimized approximate waveform of FIG. 3.

Referring now to FIG. 5, therein is shown a graph of the variation 500 in the error of the optimized approximate sawtooth waveform 300 that accompanies variation in the phase of the second harmonic component thereof in the same time interval of interest ($t_0$=2.5 ps to $t_1$=15 ps).

The horizontal axis shows the phase $\phi$ of the second harmonic component, with the phase of the second harmonic component in the optimized waveform indicated as 0 radians. The vertical axis shows the value $\mu$ of the standard deviation with respect to $\phi$. The graph in FIG. 5 thus shows how the error of the generated sawtooth waveform approximation will vary with respect to the ideal waveform according to the variation of the phase $\phi$ of the second harmonic component. As can be seen from this graph, the standard deviation of the generated waveform is minimized by optimization according to the present invention, reducing error by 1 to 2 orders of magnitude.

As thus taught herein, the waveform approximation is generated by adding or summing several waveform components that are adjusted in amplitude and phase relationship as defined above. In some of these cases, depending upon the particular waveform approximation being generated, one or more of the individual waveform components may be very small. In such a case, it may be possible to generate the waveform more economically by omitting such small components, e.g., components smaller than a threshold defined by the user. For example, a threshold might be defined as not having an adverse impact upon the standard deviation value greater than some amount, such as, for example, 1%. Alternatively, a maximum standard deviation value might be defined, and small waveform components could then be eliminated (i.e., not generated) as long as the net resulting standard deviation stayed below that threshold level.

Conversely, if optimization still results in a standard deviation value that is greater than desired, additional, higher-frequency components could be added to the signals being generated, or could be used to replace generated signal components having smaller influences on the standard deviation, to achieve the desired standard deviation value.

Synthesized waveforms generated efficiently and economically by the present invention can be used in many diverse applications. One such application, taught by the present invention, is frequency conversion, with particular advantages in optical frequency conversion.

When light passes through a physical medium, the effect on the phase of the light is proportional to the transit time delay caused by the physical medium. This time delay, in turn, is proportional to the refractive index of the medium. Furthermore, since the cycle time or time period of the phase of the light provides the frequency of the light, the incremental time period of the delay time caused by the physical medium correspondingly provides the shift in the frequency of the light. Accordingly, the frequency of the light can be varied or changed by causing the refractive index of the medium to vary or change over time. For example, if the variation in the refractive index is proportional to time during a certain period, a corresponding frequency shift that is similarly proportional occurs during this same period, so that an optical frequency conversion can be performed.

As will be developed further below, one embodiment of optical frequency conversion according to the present invention utilizes a light transmission medium whose refractive index varies linearly with respect to time. In this embodiment, the refractive index of the medium is proportional to n(t), since the proportionality constant may be set to 1 without losing generality. A periodic optical signal is then propagated through the medium. For example, assume such an optical signal with a repetition period of 25 ps, in which the wave packet of interest is located in the time interval $[t_0, t_1]$, for example, $t_0$=2.5 ps and $t_1$=15 ps. The linearly varying portion of n(t), as taught hereinabove, is synchronized with this wave packet in this time interval. Then, since the phase modulation is proportional as a function of time t to the change in the refractive index, a substantially constant frequency shift is obtained in the desired time interval $[t_0, t_1]$ for the wave packet in the optical signal.

Figure 6:
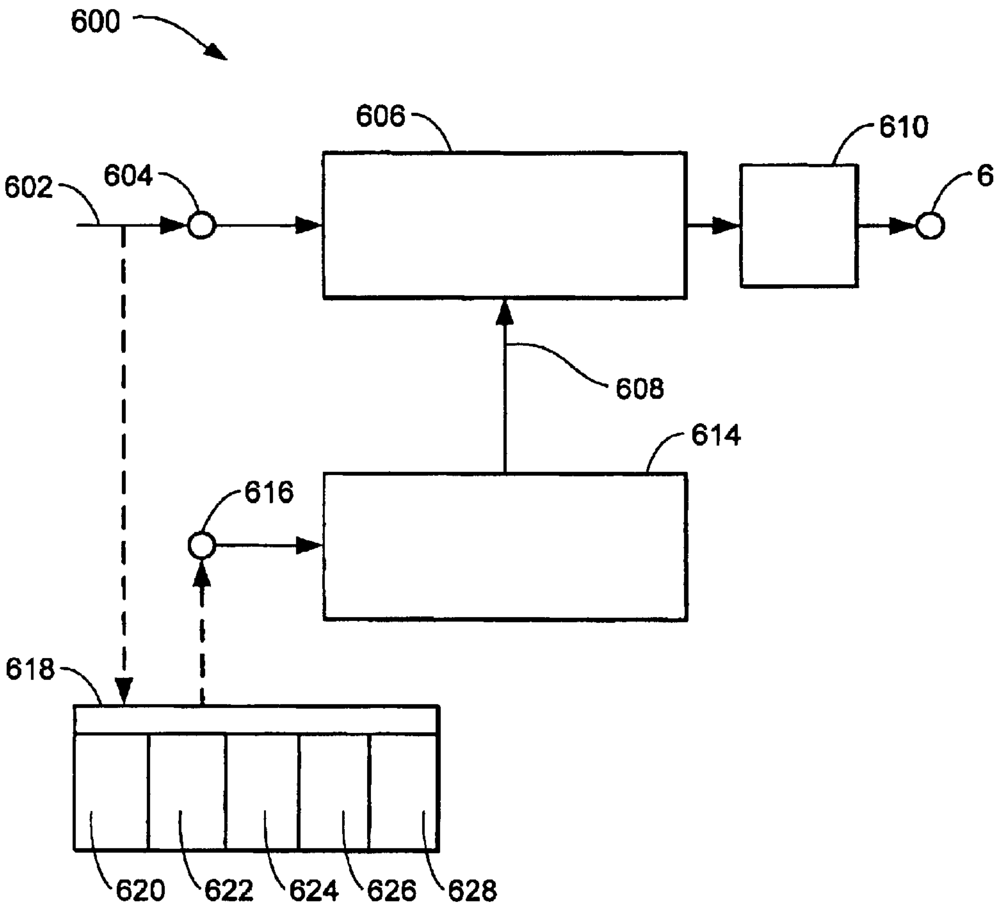
FIG. 6 is a block diagram of an optical frequency conversion device according to the present invention.

Referring now to FIG. 6, therein is shown a block diagram of an optical frequency conversion device 600 according to the present invention. An optical signal 602 that is to receive frequency conversion is inputted into an optical input terminal 604 of an optical phase modulator 606. (Optical phase modulators are available, for example, from Sumitomo Osaka Cement Co., Ltd., Tokyo, Japan.) The optical phase modulator 606 modulates the phase of the optical signal 602 in response to a modulating signal 608 that is inputted to the optical phase modulator 606 to control it. The optical phase modulator 606 outputs the phase modulated optical signal through a filter 610 to an optical output terminal 612. In operation, the optical phase modulator 606 thus functions dynamically to have the same effect upon the optical signal 602 that variation in the refractive index of a medium through which the light is transmitted would have, as discussed above.

The modulating signal 608 is provided by a modulating signal generator 614 that may be self-contained or may be controlled by an external input terminal 616. For example, the modulating signal generator 614 could be connected through the external input terminal 616 to a waveform synthesizer 618 according to the present invention. The modulating signal generator 614 would then receive from the waveform synthesizer 618 the linear portion of the synthesized waveform in the time interval $[t_0, t_1]$ as described above. As will be understood, the waveform synthesizer 618 will contain a circuit 620 for specifying the set of frequencies $f_1, \ldots, f_{max}$, a circuit 622 for specifying the component waveforms to be used in generating the waveform g(t), a circuit 624 for specifying the time interval $[t_0, t_1]$, a circuit 626 for determining the respective optimum amplitudes and phases of the component waveforms by performing a least squares optimization thereon across the time interval $[t_0, t_1]$, and a circuit 628 for producing the waveform g(t) as a sum of the respective component waveforms having the respective optimum amplitudes and phases that were determined by the least squares optimization.

Alternatively, it will be appreciated that the optical signal 602 may be split, with one branch of the optical signal being applied to the optical input terminal 604 and the other branch of the optical signal being detected by a synchronous detection circuit (for example, the waveform synthesizer 618 can provide this function) whose output is used as a modulating signal applied to the external input terminal 616, in the time interval $[t_0, t_1]$ of interest. This could be accomplished on a continuous, phase-locked basis, or alternatively the conversion could be triggered on a sporadic basis, such as whenever the light signal intensity exceeded a particular threshold level.

Figure 7:
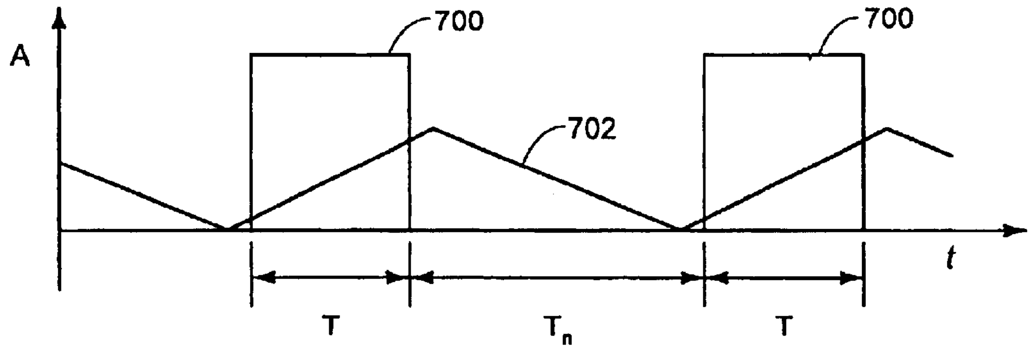
FIG. 7 is a diagram illustrating the operation of the optical frequency conversion device of FIG. 6.

Referring now to FIG. 7, therein is shown a diagram providing an example of the operation of the optical frequency conversion device 600 (FIG. 6). For illustrative purposes, an optical signal 700 having a square, pulsed configuration, is depicted as the optical signal (e.g., the optical signal 602 in FIG. 6) that is being input into the optical phase modulator 606 (FIG. 6). Illustratively also, a modulating signal 702 is depicted having a non-symmetrical sawtooth configuration, and serves as the modulating signal 608 (FIG. 6) for the optical phase modulator 606. The relationship between the optical signal 700 and the modulating signal 702, which are in phase with each other, is illustrated in FIG. 7.

Responding to the modulating signal 702, the optical phase modulator 606 in the optical frequency conversion device 600 then modulates the phase of the optical signal 700. The output optical signal $V_0$ appearing on the optical output terminal 612 (FIG. 6) may then be expressed as:

$$V_0 = A\times\sin(\omega_0 t + aV + b), \qquad \text{[Equation 6]}$$

where the optical signal 700 is $A\times\sin(\omega_0 t+\phi)$, the modulating signal 702 is V, the phase modulation relationship is $\phi=aV+b$, a and b are constants, t is time, and A, $\omega_0$ and $\phi$ are the amplitude, angular frequency and phase modulation term of the optical signal 700.

In this illustrative embodiment, the modulating signal 702 has a fixed slope in the time interval T of interest ($T=[t_0, t_1]$), other time intervals being indicated by $T_n$. If this is expressed as $aV+b=\omega_m t+\phi_0$, then:

$$V_0 = A\times\sin(\omega_0 t + aV + b) = A\times\sin(\omega_0 t + \omega_m t + \phi_0) = A\times\sin((\omega_0+\omega_m)t+\phi_0), \qquad \text{[Equation 7]}$$

so that the frequency of the output optical signal is $\omega_0+\omega_m$. A positive or negative frequency conversion will then be performed according to whether the slope of the modulating signal 702 is positive or negative, that is, according to whether $\omega_m$ is positive or negative. In frequency conversion, it will be appreciated that the slope of the modulating signal 702 is important, while its phase offset is not as important.

The filter 610 (FIG. 6), which is optional, may be selected to allow only the output optical signal frequency component $(\omega_0+\omega_m)$ from the optical phase modulator 606 (FIG. 6) to pass through to the optical output terminal 612 (FIG. 6). A band-pass filter, low-band filter, or high-band filter, for example, may be used, according to cost considerations and the necessity to eliminate unnecessary signals depending upon the particular application at hand.

Example values can be given to illustrate the frequency modulation and conversion. Assume for instance that the configuration of the optical signal 602 (FIG. 6) is a wave packet of signal light that is propagated at an input wavelength on the optical input terminal 604 of 1.55 $\mu$m, and that the optical frequency conversion device 600 performs the optical equivalent of transmission through a physical medium in which the variation of the refractive index is n(t). Assume also that n(t) varies in a sawtooth pattern, having a value of 1.5 at a time of 0 ps, decreasing linearly to 1.499 at a time of 17.5 ps, and then increasing again to 1.5 at a time of 25 ps. If the equivalent refractive index is varied in this manner, an output of 1.547 $\mu$m is obtained as the output wavelength at the decreasing interval from 0 to 17.5 ps. A wavelength modulation of several nm is thus obtained.

Figure 8:
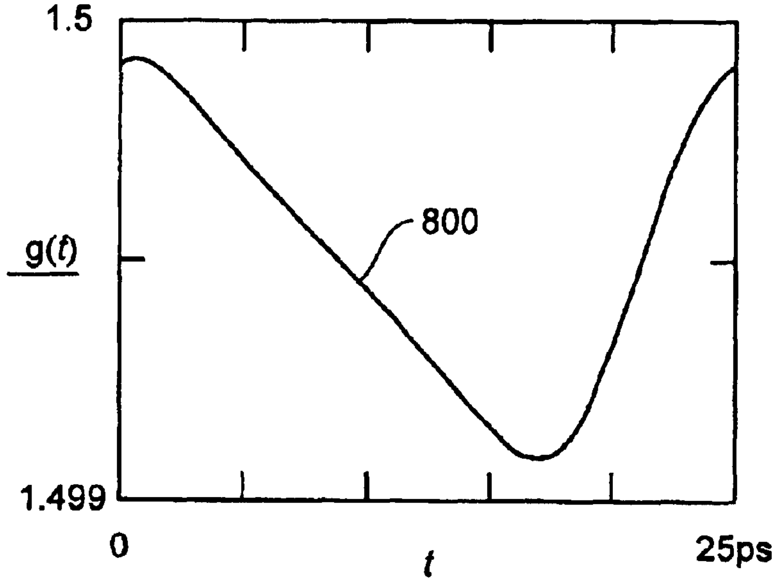
FIG. 8 is a waveform diagram of a generated, approximate sawtooth wave in accordance with the present invention.

Referring now to FIG. 8, therein is shown a waveform diagram of a wave 800 that is a generated, approximate sawtooth wave in which the time interval of 2.5 ps to 15 ps has been optimized with an upper-limit frequency $f_{max}$, of 120 GHz.

Figure 9:
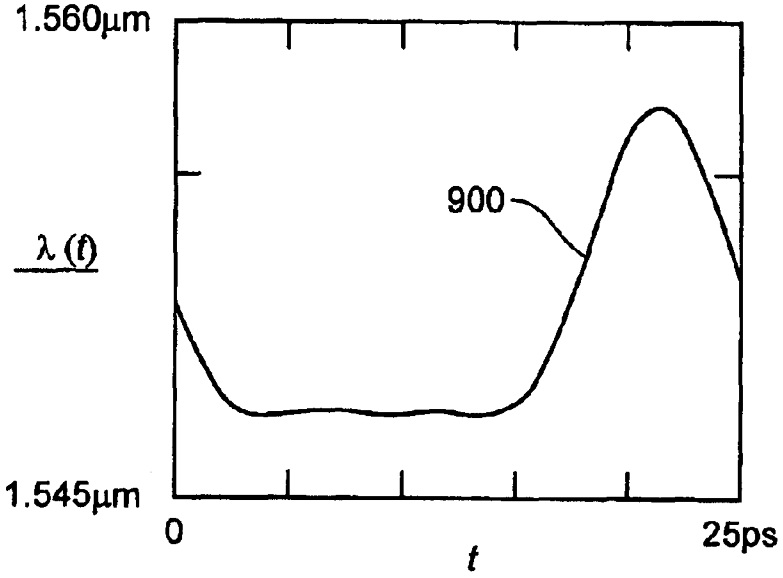
FIG. 9 is a graph of the wavelength of an optical signal whose frequency has been converted by the optical frequency conversion device of FIG. 6.

Referring now to FIG. 9, therein is shown a graph of the wavelength 900 of an optical signal whose frequency has been converted by the optical frequency conversion device 600 (FIG. 6) in response to modulation by the wave 800 shown in FIG. 8.

As described earlier, real-world band-limited environments make it extremely difficult to produce an ideal sawtooth wave, as can be seen by reference to the wave 800. Accordingly, it is extremely important to be able to accurately approximate an ideal sawtooth wave (or any other waveform) using only the low-frequency components $(f_1, \ldots, f_{max})$ of the generated waveform to achieve this close approximation. The wave 800 has thus been optimized in the interval of importance, which in this example is the time interval from 2.5 ps to 15 ps. The corresponding wavelength 900 in this same time interval shows a wavelength error of approximately only 0.07 nm compared with an ideal target wavelength.

Figure 10:
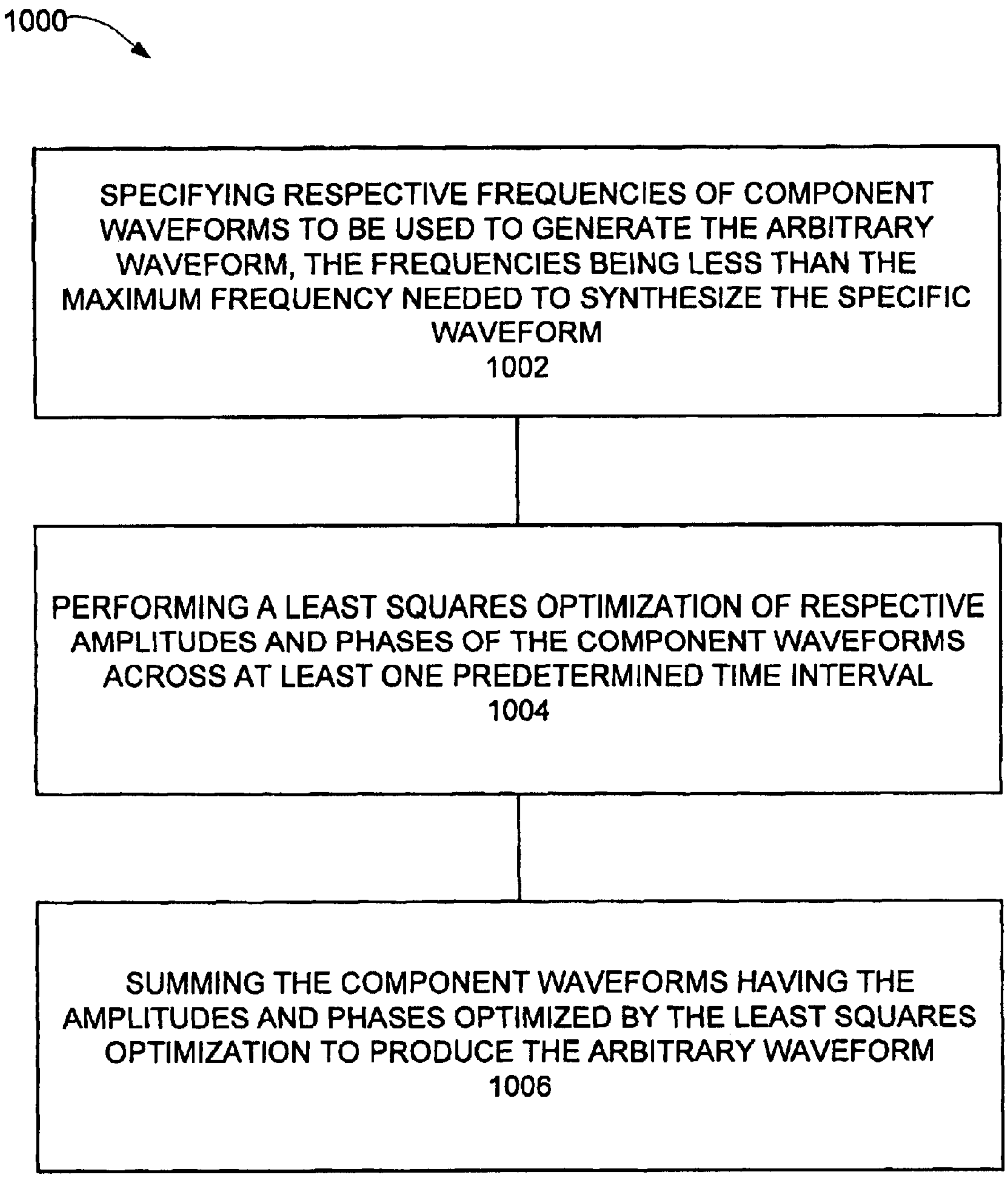
FIG. 10 is a flow chart of a method for synthesizing waveforms in accordance with the present invention.

Referring now to FIG. 10, therein is shown a flow chart of a method 1000 for synthesizing waveforms in accordance with the present invention. The method includes, in a block 1002, specifying respective frequencies of component waveforms to be used to generate the arbitrary waveform, the frequencies being less than the maximum frequency needed to synthesize the specific waveform; in a block 1004, performing a least squares optimization of respective amplitudes and phases of the component waveforms across at least one predetermined time interval; and, in a block 1006, summing the component waveforms having the amplitudes and phases optimized by the least squares optimization to produce the arbitrary waveform.

Thus, it has been discovered that the waveform synthesizing and frequency conversion method and apparatus of the present invention furnish important and heretofore unavailable solutions, capabilities, and functional advantages, particularly for electro-optical and data transmissions systems.

For example, the above description has been with reference to ideal sawtooth waveforms with intervals that vary linearly with respect to time, and frequency conversions that similarly vary linearly with respect to time. However, nonlinear functions are also readily comprehended by the present invention.

The modulating signal generator 614 (FIG. 6) may be a digital waveform synthesizing apparatus ("arbitrary waveform generator"). Alternatively, the modulating signal generator 614 may utilize a single fundamental wave generator coupled with one or more higher harmonic generators, filters, and variable-delay or phase shifter devices, as well as variable-gain amplifiers, to synthesize the desired band-limited waveform approximation. This can result in savings since harmonic generators are usually less expensive than stand-alone wave generators, particularly for higher-frequency regions. The settings of the various filters, delay circuits, phase shifters, variable-gain amplifiers, and so forth can be manually or automatically determined and pre-set into the system, or can be performed real-time, such as by successive calculations.

In another configuration, the present invention can be constructed using separate, phase-locked oscillators having controllable phase differences, the several oscillator outputs then being added as taught herein.

The frequency components $f_1, \ldots, f_{max}$ for the band-limited waveform approximation may have a harmonic relationship, such as 0 GHz, 40 GHz, 80 GHz, 120 GHz, and so forth, or 0 GHz, 50 GHz, 100 GHz, 150 GHz, and so forth, or some other similar relationship.

Alternatively, another embodiment may be utilized in which the frequency components are not in a harmonic relationship (i.e., the components have frequency ratios that are not rational fractions), and these may be used continuously or may be periodically switched on and off. Depending upon the band-limited waveform that is to be approximated, this can lead to improvement in the precision of the approximation. Of course, where certain components are periodically switched on and off, frequencies will need to be selected at which such on-off operation is feasible.

In still other configurations, it may be possible to determine that certain frequency components (especially where the components have a harmonic relationship) can be eliminated when those components do not greatly influence the desired level of approximation. This will lead to simplification of the overall apparatus and commensurate cost savings.

It will also be understood that the above-described examples were limited to brief, continuous time intervals illustrating basically one period of a synthesized waveform. However, depending upon the desired time interval for which an approximation is to be made, several waveform periods or other appropriate intervals may be employed in an intermittent manner.

Additionally, the present invention is not limited just to the modulation of optical signals. Rather, electrical and/or acoustical signals, and so forth, may also be modulated according to the teachings herein.

The resulting processes and configurations are straightforward, economical, uncomplicated, highly versatile and effective, and readily compatible with conventional technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for synthesizing an arbitrary waveform that approximates a specific waveform, the method comprising:

specifying respective frequencies of component waveforms to be used to generate the arbitrary waveform, the frequencies being less than the maximum frequency needed to synthesize the specific waveform;

performing a least squares optimization of respective amplitudes and phases of the component waveforms across at least one predetermined time interval; and summing the component waveforms having the amplitudes and phases optimized by the least squares optimization to produce the arbitrary waveform.

2. The method of claim 1 further comprising performing the least squares optimization by integrating across the specified time interval the square of the difference between the specific waveform and the sum of the respective component waveforms as a function of time, and solving for a minimum value.

3. The method of claim 1 wherein the component waveforms are harmonically related.

4. The method of claim 1 further comprising omitting at least one of the component waveforms when its respective optimum amplitude is less than a predetermined value.

5. The method of claim 1 further comprising phase-modulating an input signal in response to at least a portion of the arbitrary waveform to perform frequency conversion on the input signal.

6. A method for synthesizing a waveform g(t) that approximates a waveform n(t), the method comprising:

specifying respective frequencies $f_1, \ldots, f_{max}$ of component waveforms to be used to generate the waveform g(t), the frequencies $f_1, \ldots, f_{max}$ being less than the maximum frequency needed to synthesize the waveform n(t);

performing a least squares optimization of respective amplitudes and phases of the component waveforms across at least one predetermined time interval using the equations:

$$\frac{\partial \xi}{\partial a_j} = \frac{\partial}{\partial a_j}\int_{t_0}^{t_1} [n(t) - g(t)]^2\, dt$$

$$\frac{\partial \xi}{\partial b_j} = \frac{\partial}{\partial b_j}\int_{t_0}^{t_1} [n(t) - g(t)]^2\, dt$$

; and superimposing the component waveforms having the amplitudes and phases optimized by the least squares optimization to produce the waveform g(t).

7. The method of claim 6 further comprising performing the least squares optimization by integrating across the specified time interval the square of the difference between the waveform n(t) and the sum of the respective component waveforms as a function of t, and solving for a minimum value.

8. The method of claim 6 wherein the component waveforms are harmonically related.

9. The method of claim 6 further comprising omitting at least one of the component waveforms when its respective optimum amplitude is less than a predetermined value.

10. The method of claim 6 further comprising phase-modulating an input signal in response to at least a portion of the waveform g(t) to perform frequency conversion on the input signal with the frequency of the frequency converted signal being represented by the equation $V_0=A\times\sin((\omega_0+\omega_m)t+\phi_0)$.

11. Apparatus for synthesizing an arbitrary waveform that approximates a specific waveform, the apparatus comprising:

circuitry for specifying respective frequencies of component waveforms to be used to generate the arbitrary waveform, the frequencies being less than the maximum frequency needed to synthesize the specific waveform;

circuitry for performing a least squares optimization of respective amplitudes and phases of the component waveforms across at least one predetermined time interval; and circuitry for summing the component waveforms having the amplitudes and phases optimized by the least squares optimization to produce the arbitrary waveform.

12. The apparatus of claim 11 wherein the least squares optimization is performed by integrating across the specified time interval the square of the difference between the specific waveform and the sum of the respective component waveforms as a function of time, and solving for a minimum value.

13. The apparatus of claim 11 wherein the component waveforms are harmonically related.

14. The apparatus of claim 11 wherein at least one of the component waveforms is omitted when its respective optimum amplitude is less than a predetermined value.

15. The apparatus of claim 11 further comprising circuitry for phase modulating an input signal in response to at least a portion of the arbitrary waveform to perform frequency conversion on the input signal.

16. Apparatus for synthesizing a waveform g(t) that approximates a waveform n(t), the apparatus comprising:

circuitry for specifying respective frequencies $f_1, \ldots, f_{max}$ of component waveforms to be used to generate the waveform g(t), the frequencies $f_1, \ldots, f_{max}$ being less than the maximum frequency needed to synthesize the waveform n(t);

circuitry for performing a least squares optimization of respective amplitudes and phases of the component waveforms across at least one predetermined time interval using the equations:

$$\frac{\partial \xi}{\partial a_j} = \frac{\partial}{\partial a_j}\int_{t_0}^{t_1} [n(t) - g(t)]^2 \, dt$$

$$\frac{\partial \xi}{\partial b_j} = \frac{\partial}{\partial b_j}\int_{t_0}^{t_1} [n(t) - g(t)]^2 \, dt$$

; and circuitry for superimposing the component waveforms having the amplitudes and phases optimized by the least squares optimization to produce the waveform g(t).

17. The apparatus of claim 16 wherein the least squares optimization is performed by integrating across the specified time interval the square of the difference between the waveform n(t) and the sum of the respective component waveforms as a function of t, and solving for a minimum value.

18. The apparatus of claim 16 wherein the component waveforms are harmonically related.

19. The apparatus of claim 16 wherein at least one of the component waveforms is omitted when its respective optimum amplitude is less than a predetermined value.

20. The apparatus of claim 16 further comprising circuitry for phase-modulating an input signal in response to at least a portion of the waveform g(t) to perform frequency conversion on the input signal with the frequency of the frequency converted signal being represented by the equation $V_0=A\times\sin((\omega_0+\omega_m)t+\phi_0)$.

* * * * *